United States Patent [19]

Rogoyski

[11] Patent Number: 5,625,564
[45] Date of Patent: Apr. 29, 1997

[54] SYSTEM AND METHOD FOR HIERARCHICAL DEVICE EXTRACTION

[75] Inventor: Eric Rogoyski, Los Gatos, Calif.

[73] Assignee: Cadence Design Systems, Inc., San Jose, Calif.

[21] Appl. No.: 372,316

[22] Filed: Jan. 13, 1995

[51] Int. Cl.$^6$ .................................................. G06F 17/50
[52] U.S. Cl. ................................................ 364/488
[58] Field of Search ............................. 364/488, 489, 364/490, 578

[56] References Cited

U.S. PATENT DOCUMENTS

| | | | |
|---|---|---|---|
| 5,079,717 | 1/1992 | Miwa | 364/490 |
| 5,202,840 | 4/1993 | Wong | 364/490 |
| 5,210,699 | 5/1993 | Harrington | 364/488 |
| 5,301,318 | 4/1994 | Mittal | 364/489 |
| 5,490,095 | 2/1996 | Shimada et al. | 364/578 |
| 5,497,334 | 3/1996 | Russell et al. | 364/489 |

OTHER PUBLICATIONS

"Hierarchical Functional Verification for Cell–Based Design Styles" by L.G. Chen et al., IEE Proceedings, vol. 134, Pt. G., No. 2, Apr. 1987, pp. 103–109.

"PANAMAP–B: A Mask Verification System for BiPolar IC" by J. Yoshida et al., IEEE 18th Design Automation Conference, pp. 690–695.

Primary Examiner—Vincent N. Trans
Attorney, Agent, or Firm—John T. McNelis; Fenwick & West LLP

[57] ABSTRACT

A device extractor for extracting devices from a hierarchical cell design. The device extractor selects a cell from the lowest level of the hierarchy and searches the cell for the device components. The device extractor searches each cell in the lowest level and then selects a "parent" cell in the penultimate level. The parent cell, and all of the children cells of the parent cell, are searched. The selection and search process continues until all of the components of the device are identified in a cell or the children cell of the cell and a proper relationship between the components is determined. The components of the identified device are masked so that they are not identified and associated with another device during subsequent searches.

15 Claims, 14 Drawing Sheets

SYSTEM AND METHOD FOR HIERARCHICAL DEVICE EXTRACTION

BACKGROUND OF THE INVENTION

1. Field of the Invention

The invention relates to automated design verification techniques for integrated circuits, more particularly to hierarchical device extraction.

2. Description of Background Art

Many structures and systems are comprised of components whose interrelations are defined by design rules. Such structures are often designed using automated design techniques that use symbolic representations of the structure and its elements. An example of such a structure is an integrated circuit.

The physical design of an integrated circuit is frequently described in terms of the symbolic layout of the circuit, rather than the actual geometry of the masks and layers that comprise the chip. When creating mask works for integrated circuits, designers typically begin with a circuit schematic that includes an interconnected network of logic or circuit elements. One or more circuit elements can be combined to form a device. A library of mask work patterns or "cells" that correspond to the various circuit devices used in the design is available to the circuit designer. The designer can thus work with symbolic representations of transistors, wires, and other primitive components, and groups of these components to form a device. These symbolic representations provide a higher level of abstraction than the mask layout. Working at a higher level of abstraction simplifies the design task by allowing the designer to concentrate on designing with higher level devices instead of designing with the low level circuit elements. The use of a symbolic representation allows the designer to simulate and verify the logical operation of the circuit before actual fabrication.

A symbolic layout containing only primitive symbols, i.e. symbols representing transistors, wires, capacitors and other physical components, is termed a "leaf cell." The connections between cells are called "ports." Many layouts contain a large number of substantially identical groups of components or devices. Such a group of components define a cell. The description of the layout can be simplified by treating each group of components as an instance of the particular cell. Each cell is represented symbolically. For example, a cell can be represented as a rectangle with various ports for connecting wires or for abutment with ports of adjacent cells that are similarly represented. The components of the overall layout may consist of many cells, and the layout represents their relative placement and interconnection. Describing the layout in terms of cells rather than primitive symbols further simplifies the task of the designer.

The process of grouping elements and cells may be repeated so that a symbolic layout can be treated as a hierarchical structure with multiple levels. Each level is a symbolic layout of cells and primitive components. Each cell is in turn a symbolic layout of sub-cells and primitive components. The sub-cells and primitive components of a "parent" cell comprise the next lower level in the hierarchy. Since there may be more than one type of cell at any given level, the next lower level may contain several different branches. The cells at the lowest level are leaf cells since they contain no sub-cells, only primitive components, as described above. Cells at any other level are "hierarchy cells." The hierarchy can be visualized as an inverted "tree" with branches extending downward, and the lowest level depends on the branch in which it is located. The leaf cells are at the ends of the branches, and the trunk of the tree represents the symbolic layout of the whole chip, which is often termed the "root cell." This hierarchical description is a natural and concise representation for large designs.

Once the symbolic layout is designed it is tested to verify its logical functioning. Any defective operation is remedied by design changes and the modified design is re-verified. When verifying an integrated circuit design, each device in the design must be extracted, i.e., located and identified. The interconnections between the devices are then checked, and place and routing designs are then verified.

A device is a combination of components that perform a particular function. Device extraction is the process of locating devices within the integrated circuit design. Conventional verification systems require all of the device components to be wholly contained within one cell in order to be identified. In order to verify an integrated circuit design that contains cells in a hierarchical format, the cell must be leveled before device extraction can begin. Leveling occurs because a device design cannot be extracted if it is located in multiple cells. As integrated circuit designs become more complicated design conventional design verification tools requires an inordinate amount of time to verify an integrated circuit design because of the large number of devices.

What is needed is a system and method for extracting a device from a circuit design in which the cells are not leveled for each device that is contained in two or more cells of the cell hierarchy.

SUMMARY OF THE INVENTION

In accordance with the system and method of the present invention, device extraction from a hierarchical cell design proceeds by selecting a cell from the lowest level of the hierarchy and by searching the cell for the device components. A device extractor searches each cell in the lowest level and then selects a "parent" cell in the penultimate level. The parent cell, and all of the children cells of the parent cell, are searched. The selection and search process continues until all of the components of the device are identified in a cell and in the children of the cell and a proper relationship between the components is determined. The components of the identified device are masked so that they are not identified and associated with another device during subsequent searches.

DETAILED DESCRIPTION OF THE PREFERRED EMBODIMENTS

A preferred embodiment of the present invention is now described with reference to the figures where like reference numbers indicate identical or functionally similar devices. Also in the figures, the left most digits of each reference number corresponds to the figure in which the reference number is first used.

The invention is directed to a system and method for device extraction from a hierarchical cell design. The device extractor selects a cell from the lowest level of the hierarchy and searches the cell for the device components. The device extractor searches each cell in the lowest level and then selects a "parent" cell in the penultimate level. The parent cell, and all of the children cells of the parent cell, are searched. The selection and search process continues until all of the components of the device are identified in a cell or the children cells of the cell and a proper relationship between the components is determined. The components of the identified device are masked so that they are not identified and associated with another device during subsequent searches.

Figure 1:
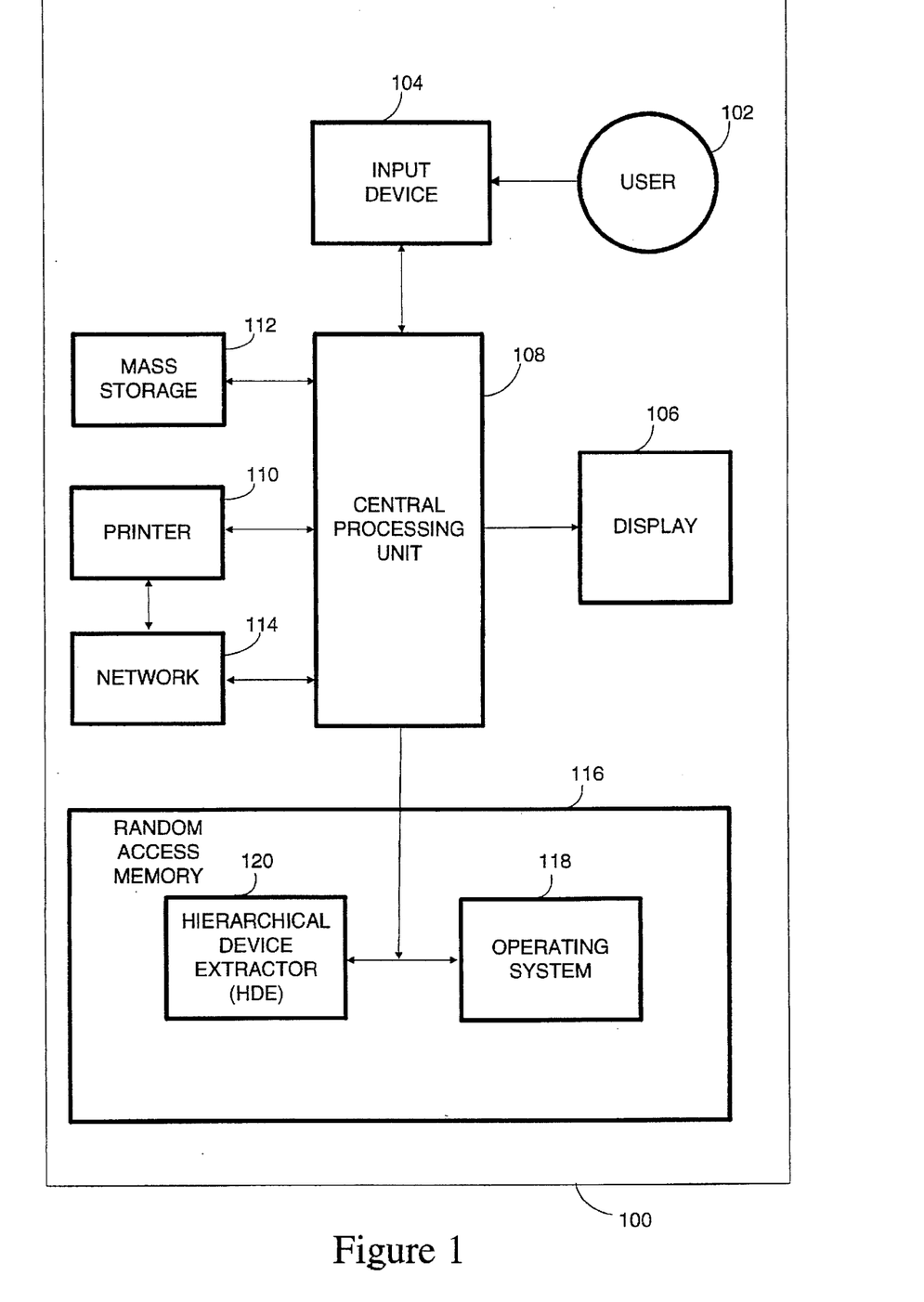
FIG. 1 is an illustration of a computer system in which the preferred embodiment operates.

FIG. 1 is an illustration of a computer according to a preferred embodiment. The computer system 100 includes an input device 104 coupled to a central processing unit (CPU) 108, the CPU 108 is also coupled to a display monitor 106, a printer 110, a mass storage device 112 and random access memory (RAM) 116. During computer operation the RAM 116 includes an operating system 118 and a hierarchical device extractor 120. The input device 104, CPU 108, display 106, printer 110, and mass storage 112 are all part of a conventional computing system, e.g., a SPARC Station 20 (commercially available from Sun Microsystem, Inc., Mountain View, Calif.). In some embodiments the computer system is coupled to a network 114. The RAM 116 includes an operating system 118, e.g., UNIX, and also includes a hierarchical device extractor (HDE) program 120 that is described in detail below.

Figure 2:
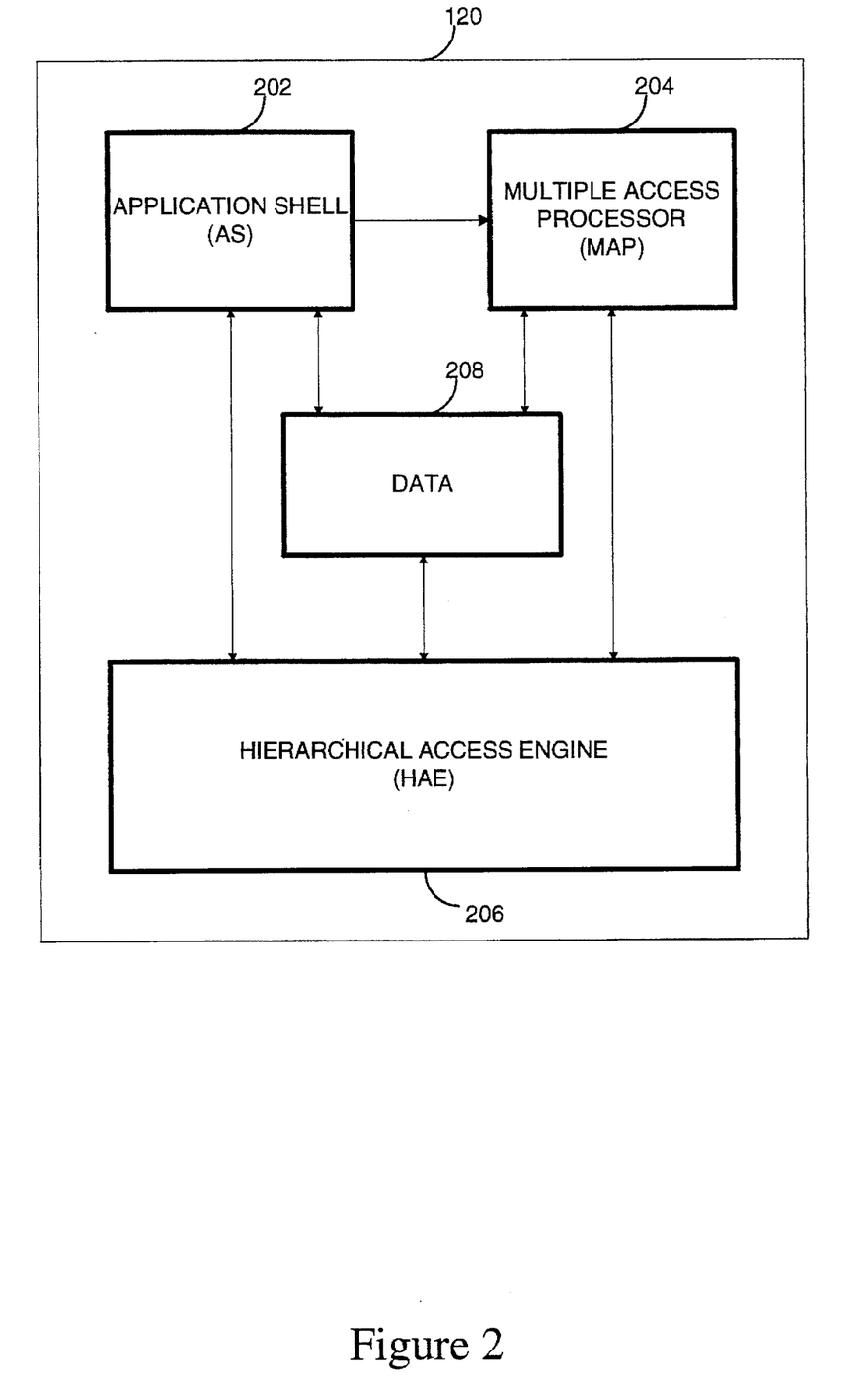
FIG. 2 is a more detailed illustration of the hierarchical device extraction module of the preferred embodiment.

FIG. 2 is a more detailed illustration of the hierarchical device extractor module 120. The hierarchical device extractor module 120 comprises an application shell module (AS) 202, a multiple access processor module (MAP) 204, a hierarchical access engine module (HAE) 206, and a data module 208. The AS 202 uses rules data and design data, described below, to locate a device in the design data. The MAP 204 identifies elements of the device within a cell. The HAE 206 traverses the hierarchy of cells, from the parent cell to the associated leaf cell to identify interactions between device elements. The AS 202, MAP 204, HAE 206, and data module 208 are described in greater detail below with reference to FIGS. 3–10.

Figure 3:
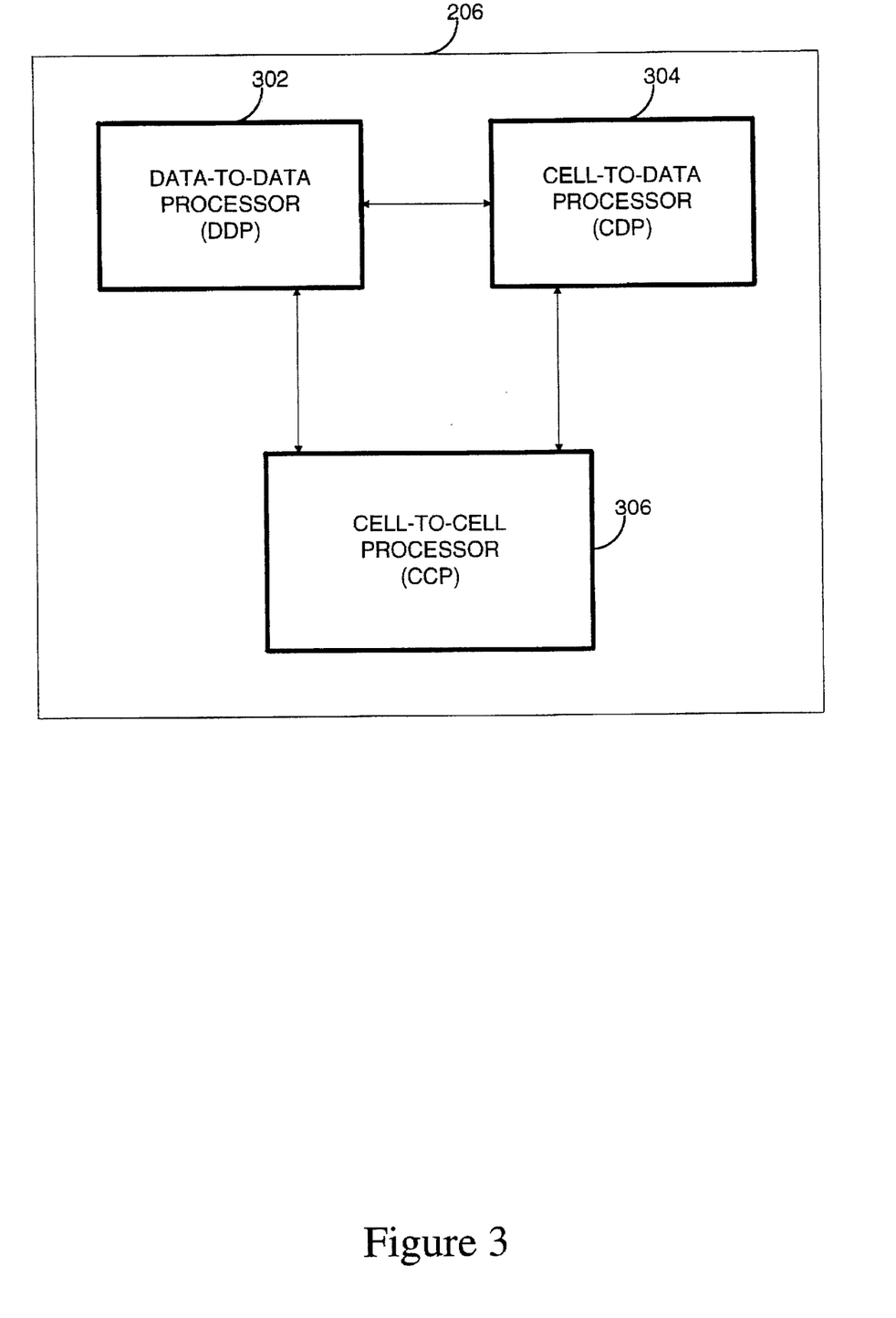
FIG. 3 is a more detailed illustration of the hierarchical access engine module of the preferred embodiment.

FIG. 3 is a more detailed illustration of the HAE 206 of the preferred embodiment. The HAE 206 comprises a data-to-data processor module (DDP) 302, a cell-to-data processor module (CDP) 304, and a cell-to-cell processor module (CCP) 306. The DDP 302 identifies the interaction between two elements that are located directly in a parent cell, i.e., not lower in the hierarchy. The CDP 304 identifies the interaction between two elements of a device where one element is located in the parent cell and one element is located in a child cell, i.e., lower in the hierarchy. The CCP 306 identifies the interaction between two elements of a device where both elements are located at a level that is lower in the hierarchy than the parent cell. The DDP 302, the CDP 304, and the CCP 306 are discussed in greater detail below. Device extraction is the process of identifying a device (e.g., an NPN transistor), within an engineering design, e.g., an integrated circuit (IC) design. A device is a combination of one or more primitive components, e.g., an NPN transistor. As described above, a cell is a symbolic representation of primitive components, e.g., wires and transistors. Each primitive component is located on one or more layers, e.g., a metal layer. The layers are created during the fabrication process. One layer can include many primitive components taking the form of various geometries (shapes) on the layer. In addition, one layer can be a part of many cells and one cell can include many layers. The primitive components are represented symbolically as shape data. Shape data of interest to device extraction is of two varieties, recognition shape data (RS) and terminal shape data (TS). A device is represented as a combination of one RS interacting with one or more TS's in a specific manner. The identity of the RS, the TS, and their required interaction is stored in the data module 208. The required interaction between shapes is defined by a rule. An example of a rule that defines an NMOS device having one recognition shape and three terminal shapes is given below.

device(NMOS)
        recognitionShapeOn(NGATE)
        terminalsOn(POLY, NSD, NSD);

The preferred embodiment searches the cell hierarchy for device components and determines whether a combination of device components satisfy a rule pertaining to a device.

Figure 4:
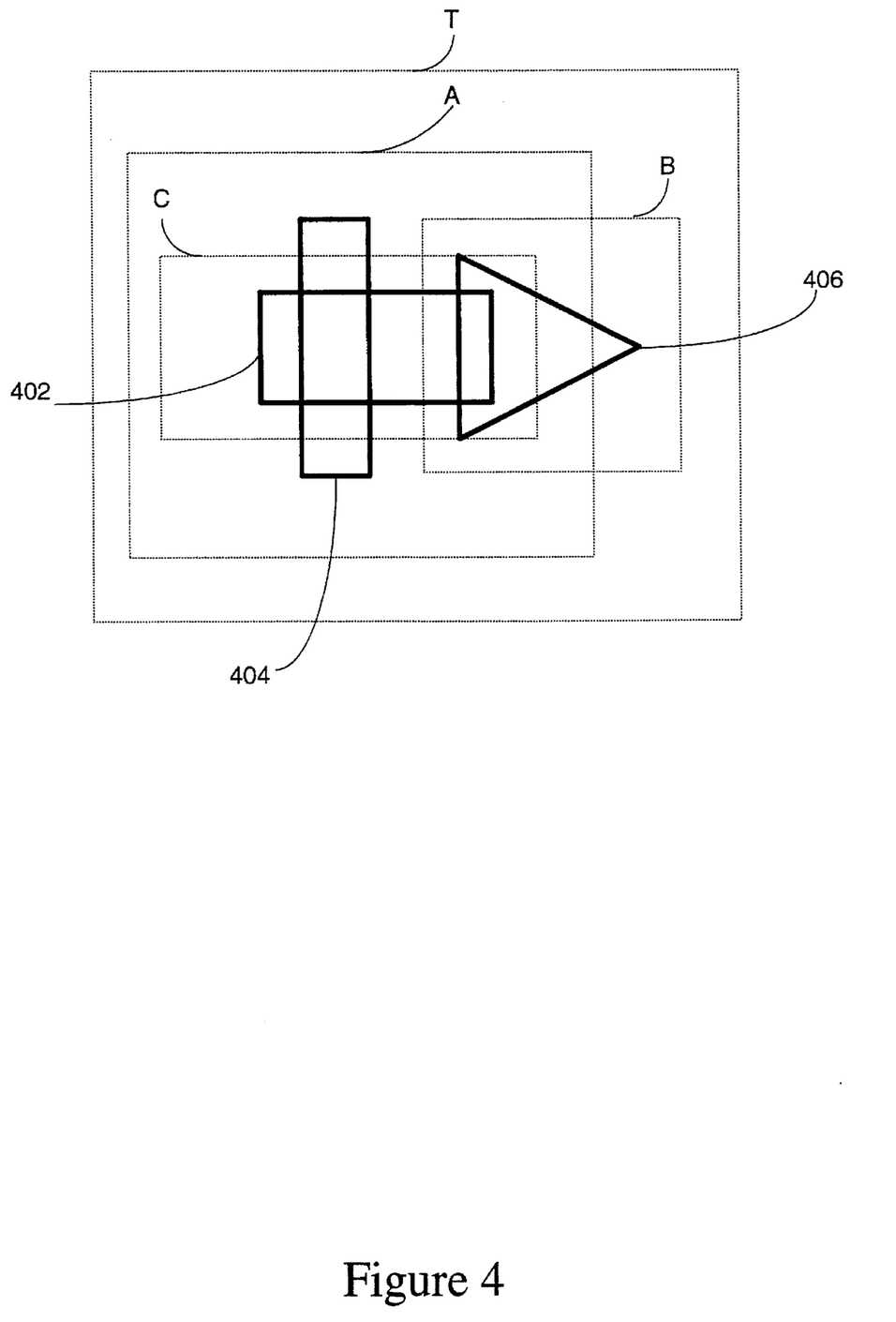
FIG. 4 is a symbolic representation of a device in an integrated circuit design.

The operating procedure or method of the hierarchical device extractor module 120 is described with reference to FIGS. 4–10. FIG. 4 is a symbolic representation of a device in an integrated circuit design. The device comprises the RS 402 and two TS's 404, 406. The cells are represented by the letters T, A, B, and C. Cell C is a leaf cell and includes the RS 402. Cell B is a leaf cell and includes TS 406. Cell A is the parent cell of cell C and includes TS 404. Cell T is the parent cell of cells A and B. A device comprises RS 402, TS 404, and TS 406 interacting in the manner shown in FIG. 4.

Figure 5A:
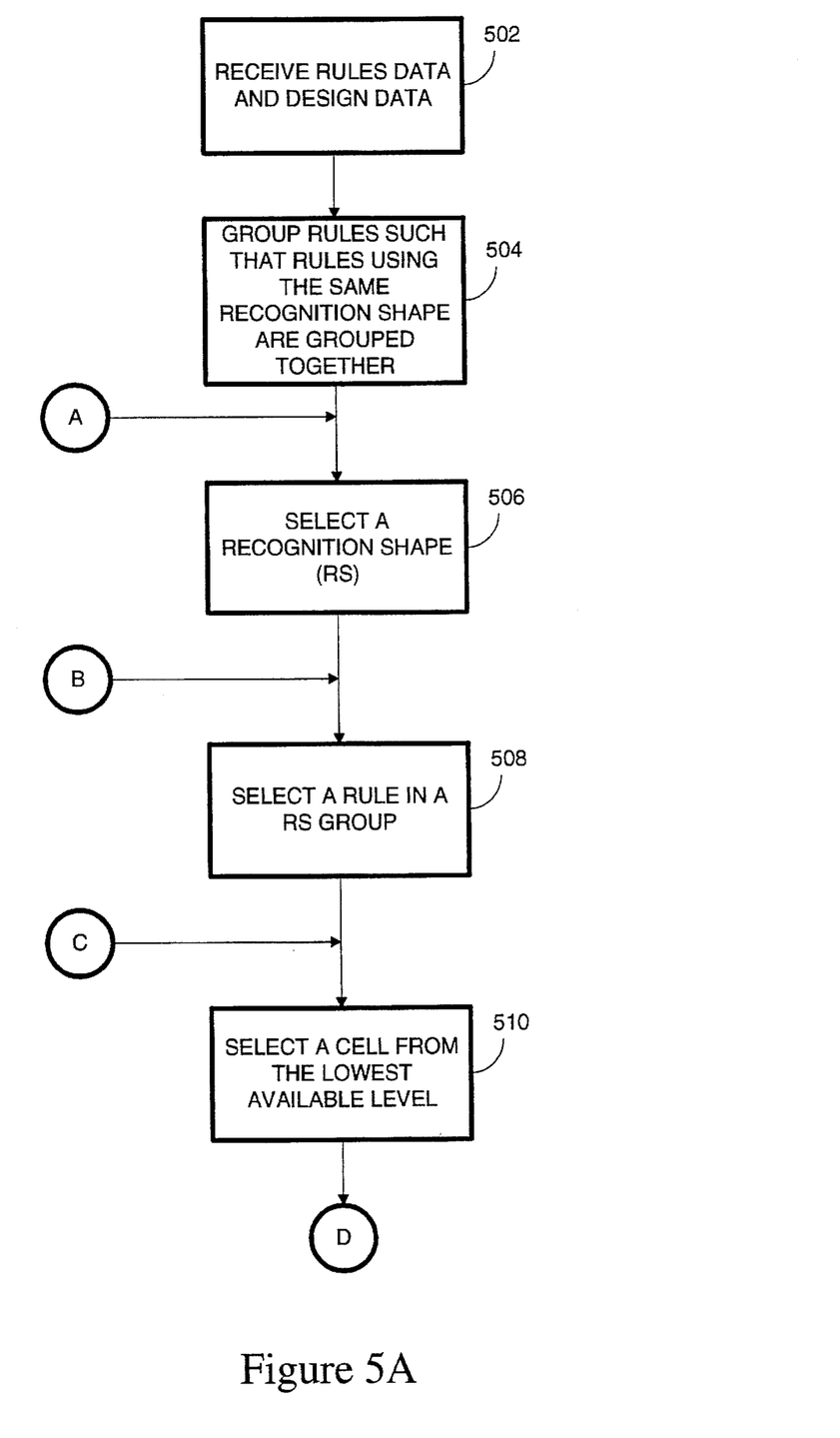
FIGS. 5A–5C are flowcharts showing the method of the application shell module of the preferred embodiment.
Figure 5B:
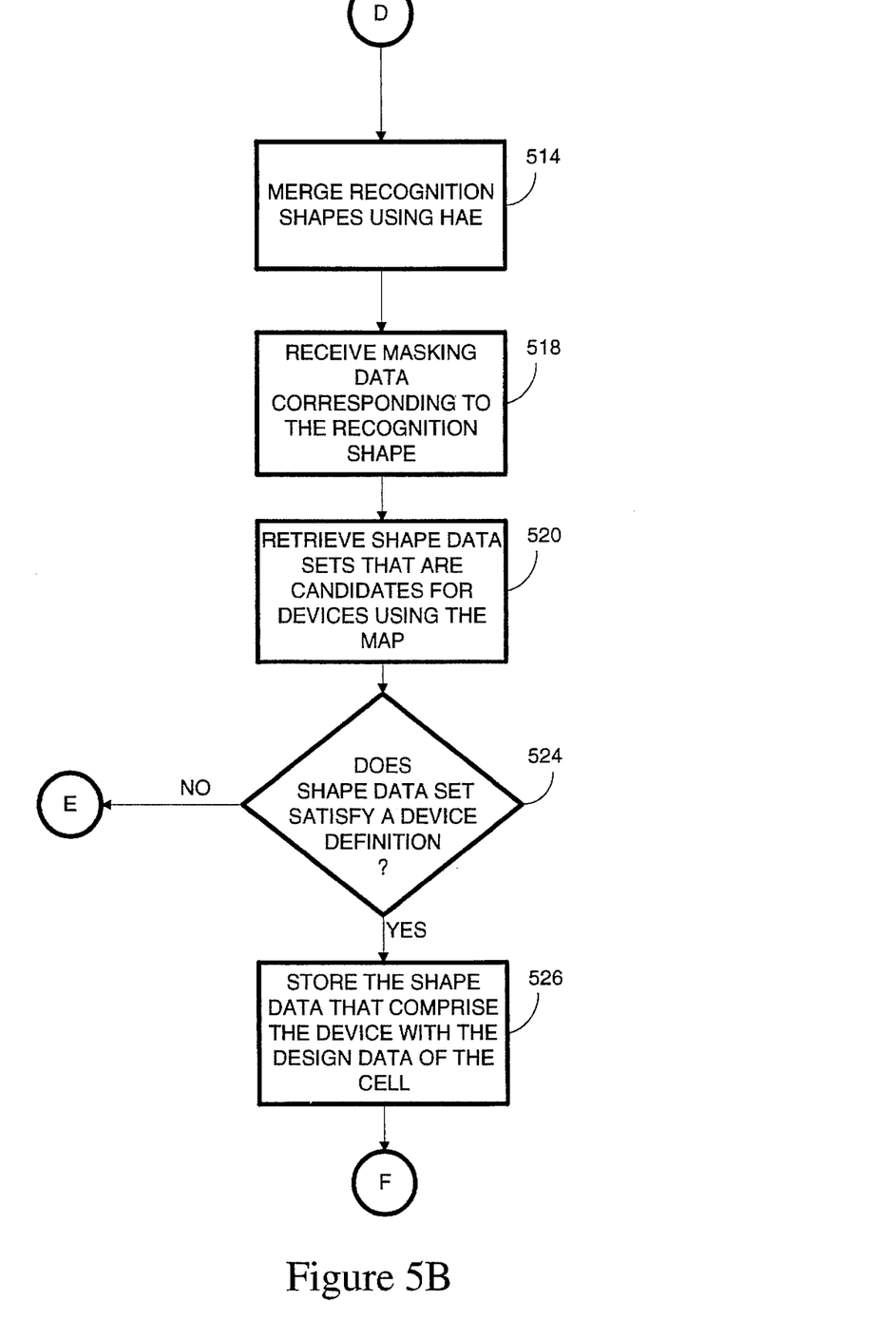
Figure 5C:
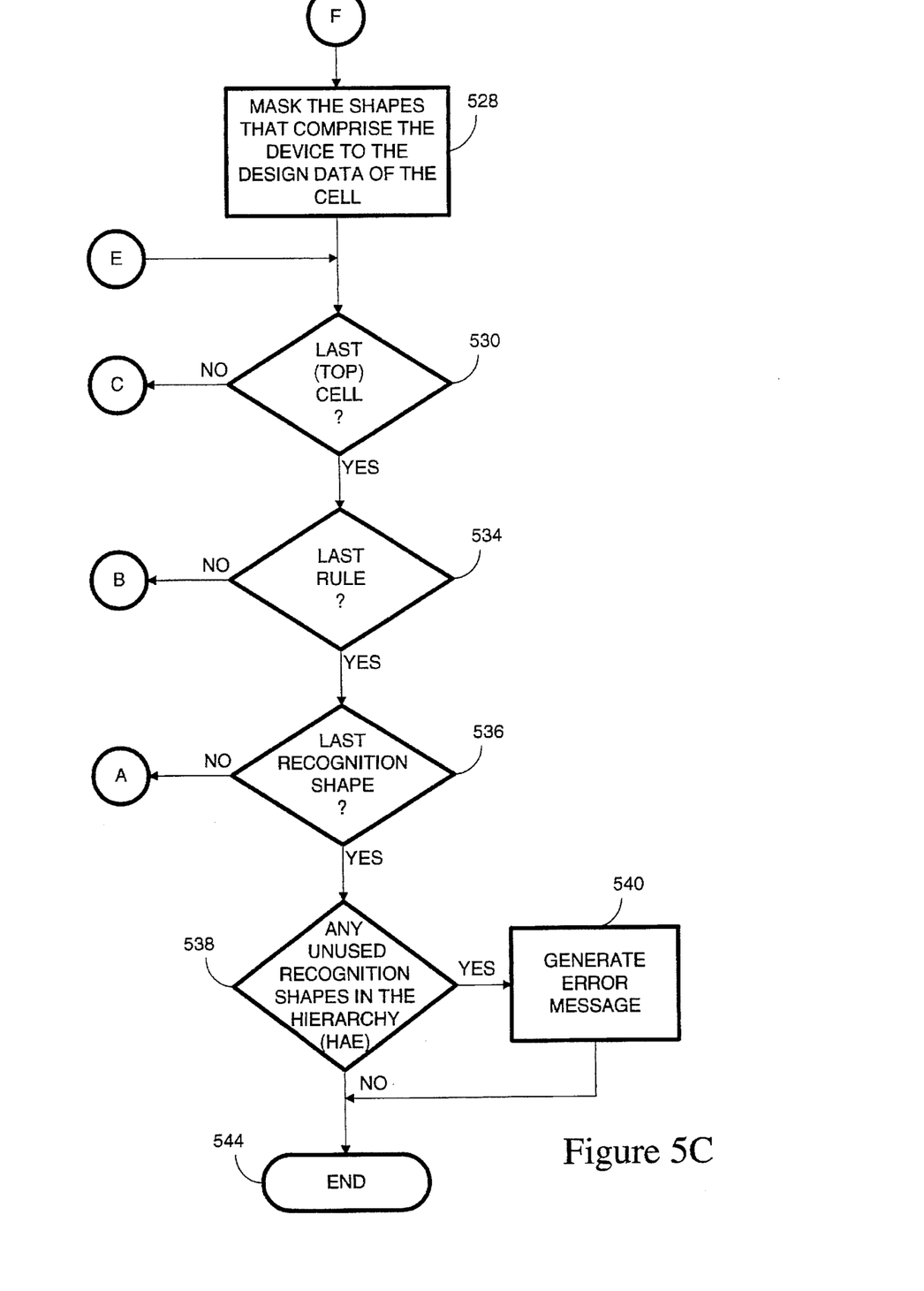

FIGS. 5A–5C are flowcharts showing the method of the application shell module (AS) 202. The AS 202 receives 502 rules data (rules) and design data from the data module 208. As stated above, the rules define the device in terms of shape data, i.e., RS and TS, and the physical relationship between the shape data. The design data is the integrated circuit design data. The design data includes cell data, shape data, and masking data. The AS 202 groups 504 the rules such that rules requiring the same RS are grouped together. For example, all rules requiring a shape on the same layer are grouped together. Such a grouping technique can increase the efficiency of the device extraction process. The AS 202 selects 506 a RS, a rule 508 from the selected RS group, and a leaf cell 510. During subsequent iterations, the AS 202 selects a cell whose children cells have previously been selected and processed. Children cells include cells that are children cells of children cells, e.g., cell C is a child cell of cell T. In the example illustrated in FIG. 4, the AS 202 selects 510 cell C, although cell B could also have been selected. The AS 202 invokes the HAE 206 to identify and merge 514 the recognition shapes located within the selected cell. The HAE 206 identifies RS 402 within cell C. The technique for identifying a shape using the HAE 206 is described below. In this example the HAE 206 does not merge any RS's because the entire RS is a single shape located within one cell, i.e., cell C. If the RS were located in two or more cells the HAE 206 would combine, e.g., merge, the RS into one shape.

The AS 202 receives 518 masking data corresponding to RS's that have been previously associated with a device. Once masked, an RS cannot be used to identify another device. The AS 202 invokes the MAP 204 to retrieve 520 shape data sets that are candidates for devices.

Figure 6:
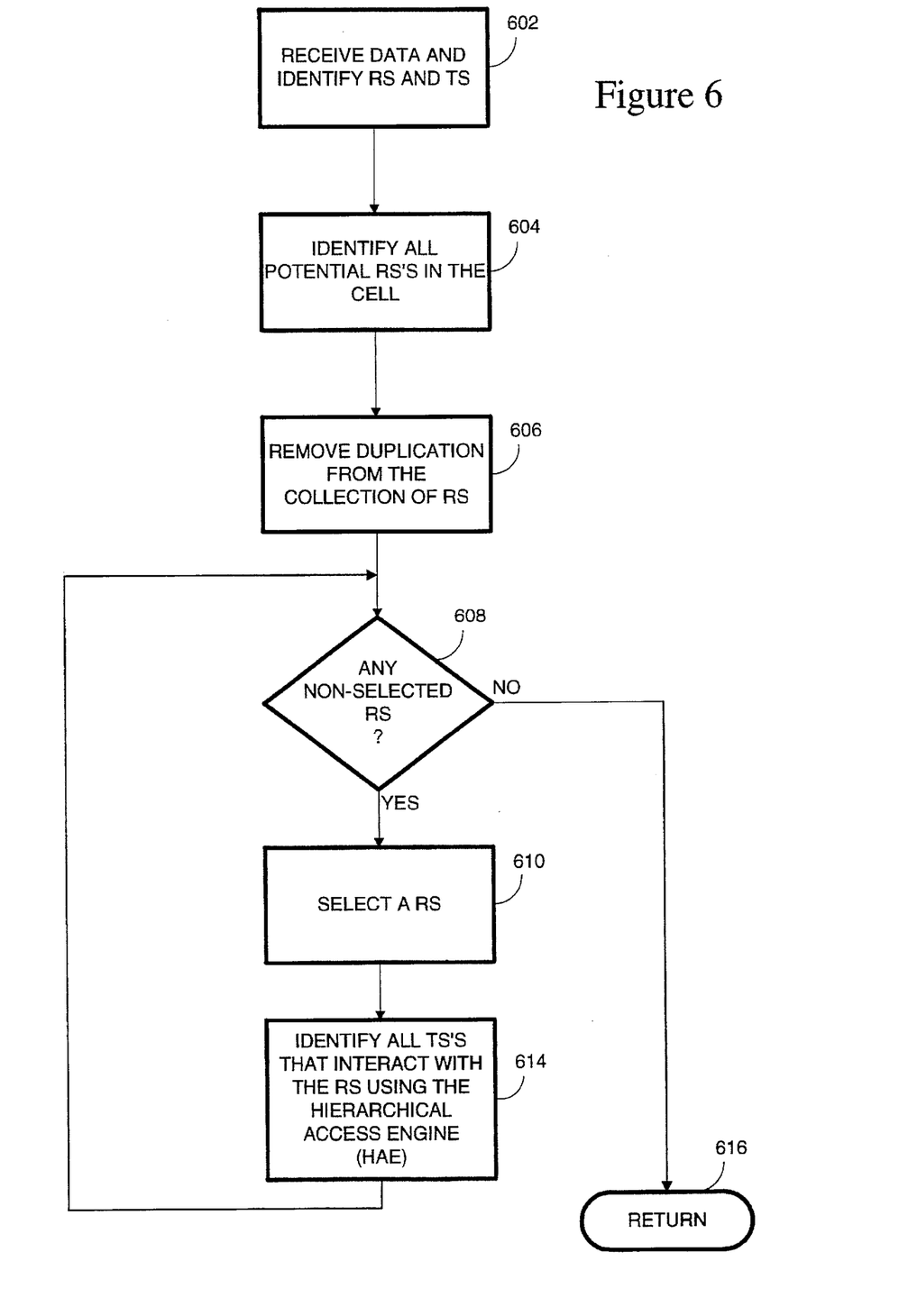
FIG. 6 is a flowchart showing the method of the multiple access processor module of the preferred embodiment.

FIG. 6 is a flowchart showing the method of the MAP. The MAP receives 602 design data from the data module 208. The MAP 204 uses the HAE 206 to identify 604 all RS's that are located in the selected cell, i.e., cell C, and all cells lower in the hierarchy than the selected cell. The method used by the HAE 206 is set forth below. Although there is only one RS for each device, there may be multiple RS's within a cell because one cell can contain multiple devices. If multiple children cells of the selected cell contained a portion of the RS, the MAP 204 combines the RS portions to identify 604 one contiguous RS. The MAP 204 then removes 606 any duplication from the RS's. RS duplication can occur when two cells overlap and contain the same RS. The MAP 204 selects 610 a RS and invokes the HAE 206 to identify 614 all TS's that interact, e.g., overlap or abut, with the selected RS.

Figure 7:
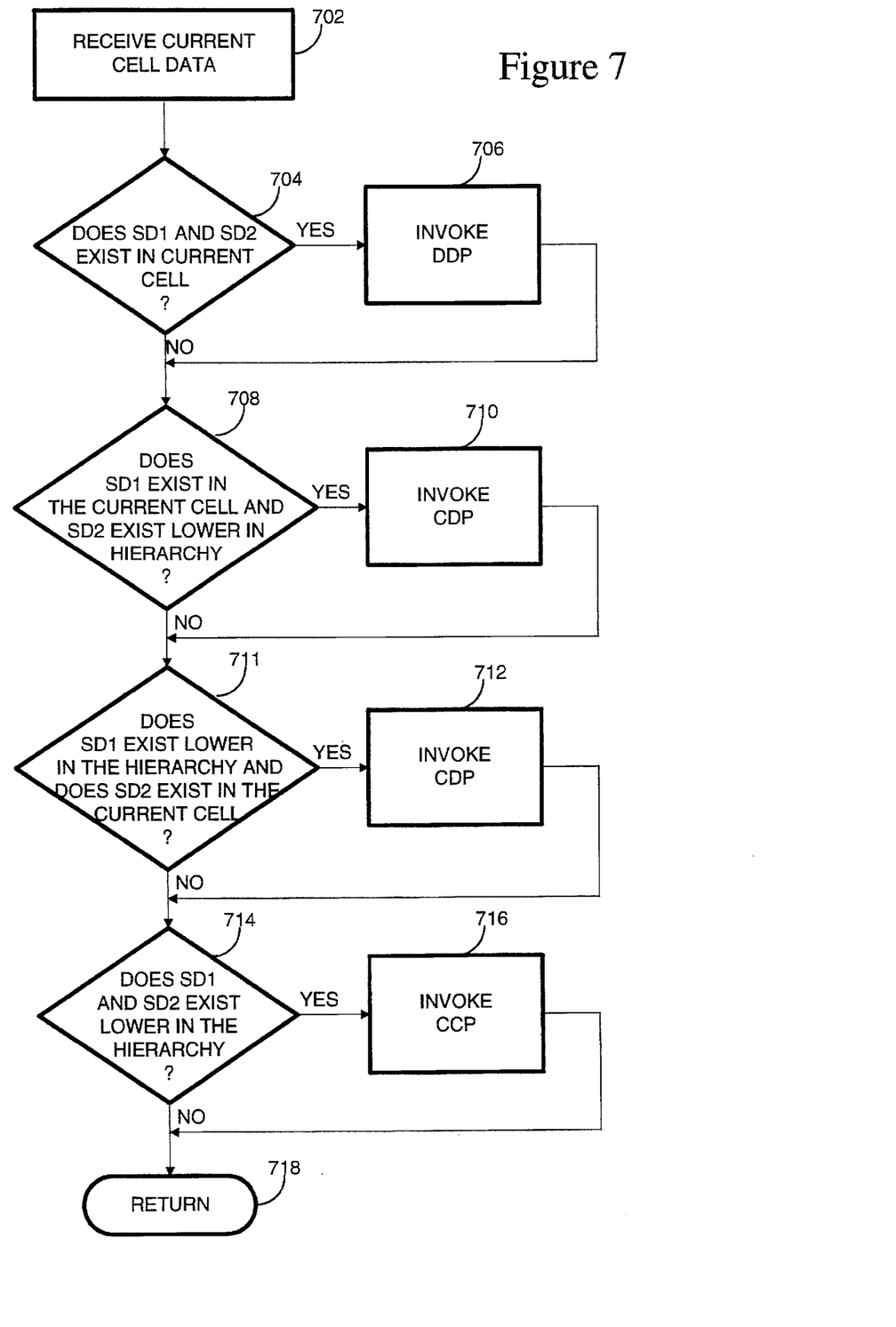
FIG. 7 is a flowchart showing the method of the hierarchical access engine module of the preferred embodiment.

FIG. 7 is a flowchart showing the technique for determining shape interaction according to the HAE 206. The HAE 206 receives 702 cell data from the data module 208, e.g., the RS and the TS to be compared. When identifying interactions between the RS and the TS, the HAE 206 determines the location of the two components (shapes), i.e., RS and TS, using design data located in the storage module 208, described below. If both shapes exist in the selected, i.e., parent, cell 704, the HAE 206 invokes 706 the DDP 302. If only one shape is in the selected cell 708, 711, the HAE 206 invokes 710, 712 the CDP 304. If both shapes are in sub-cells 714, i.e., children cells, the HAE 206 invokes 716 the CCP 306. In the example, cell C was selected. Although the RS is located within cell C, no TS's are located in cell C. Therefore, the HAE cannot identify any interactions between the RS and a TS.

The MAP repeats steps 610 and 614 until all RS's in the cell are selected 608. In the example, only one RS is located in cell C, therefore, the MAP returns functional control (control) 616 to the AS. After selecting 510 and processing 514–528 cell C, the AS 202 compares the retrieved shaped data from the HAE 306 and determines 524 if the retrieved shape data satisfies the device definition. After processing cell C, neither of the necessary TS's are identified. Therefore, the device definition is not satisfied and the AS 202 selects 510 a new cell from the lowest available level and repeats steps 510–530.

The AS 202 selects 510 cell B. A TS 406 is located within cell B. However, the RS 402 is located in cell A, which is not a child cell of cell B. Therefore, when processing cell B, the TS 406 and the RS 402 do not interact. The AS 202 determines 524 that the device definition is not satisfied because the rule is not satisfied. The AS 202 then selects 510 a new cell whose children have all been previously selected and repeats steps 514–530.

The AS 202 selects 510 cell A. The RS 402 is wholly contained within cell C. Therefore, the AS 202 does not need to merge 514 the RS, as described above. The AS 202 receives 518 RS masking data. The RS 402 is available for device identification because the RS 402 is not masked. The AS 202 invokes the MAP 204 to retrieve 520 shape data sets from the design data that are candidates for devices. The MAP 204 receives data from the data module 208 and invokes the HAE 206 to identify 602 the RS and all TS's that are fully contained within cell A and its children cells, e.g., cell C. TS 404 is identified by the HAE 206 for the MAP 204. After performing the functions defined in steps 604–610, discussed above, the MAP invokes the HAE 206 to determine if TS 404 and RS 402 interact. The HAE 206 accomplishes this by determining 708 that the TS 404 is located in the currently selected cell, i.e., cell A, and the RS 402 is located in a sub-cell of cell A, i.e., cell C. Therefore, the HAE 206 invokes 710 the CDP 304 to determine if RS 402 and TS 404 interact.

Figure 9:
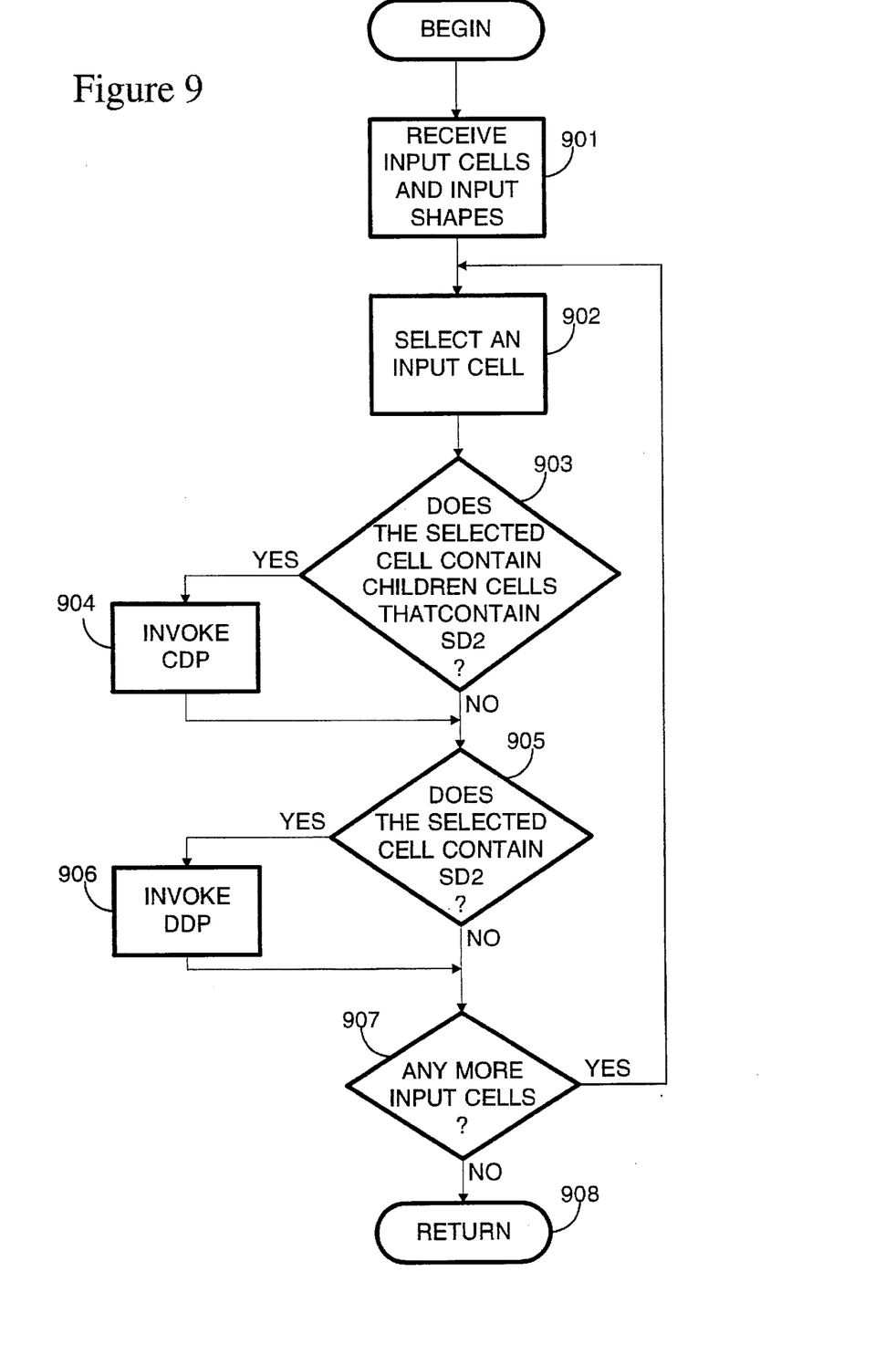
FIG. 9 is a flowchart showing the method of the cell-to-data processor module of the preferred embodiment.

FIG. 9 is a flowchart showing the method of operation of the CDP 304. The CDP 304 receives 901 a set of input cells and a set of input shapes. The CDP 304 then selects 902 an input cell. The CDP 304 selects cell C because it is the only child cell of cell A. The CDP 304 determines 903 that the RS 402 does not exist in a child cell of cell C. The CDP 304 determines 905 that the RS 402 is located within cell C and invokes 906 the DDP 302 to determine if the RS 402 and the TS 404 interact.

Figure 8:
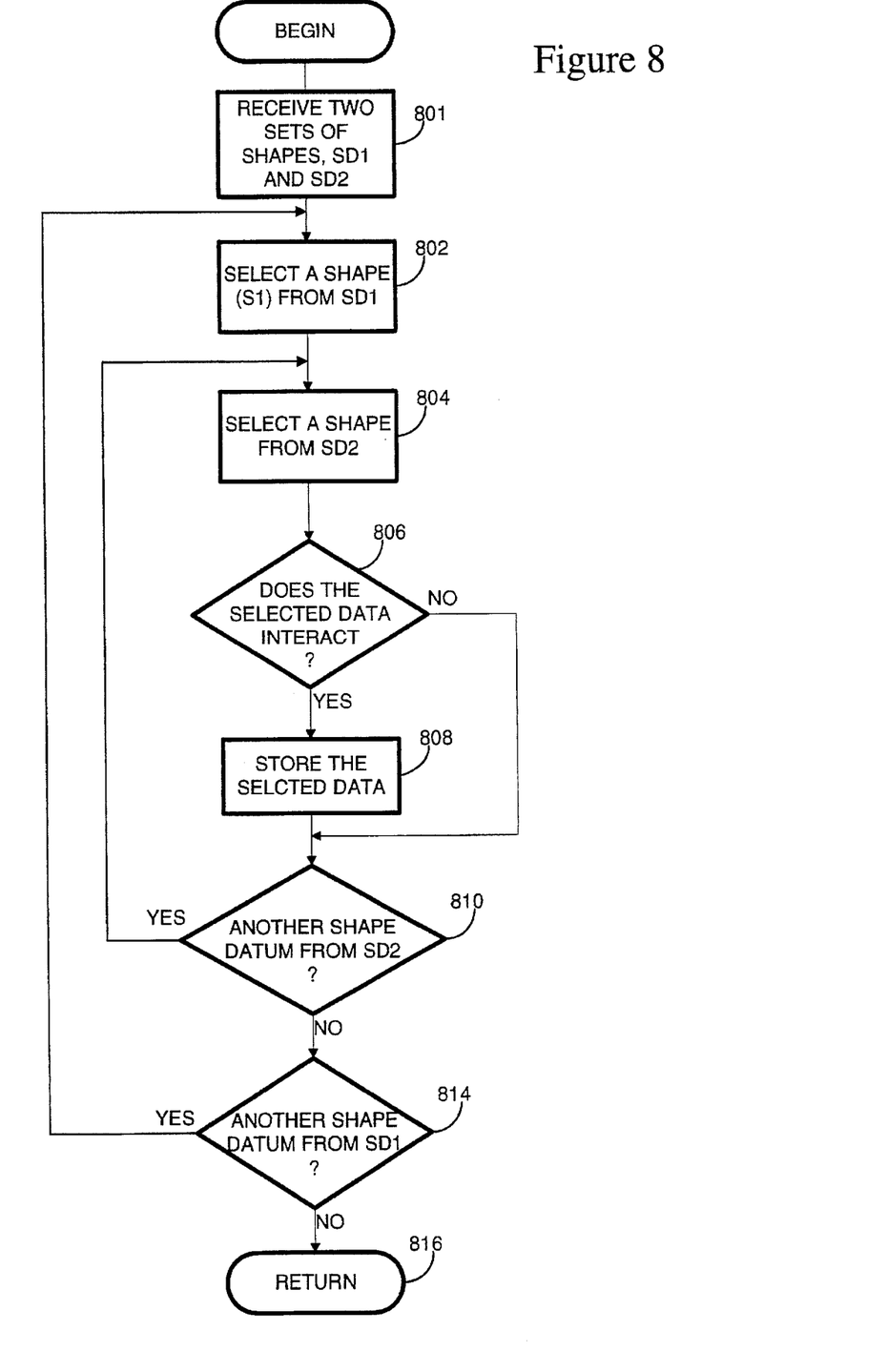
FIG. 8 is a flowchart showing the method of the data-to-data processor module of the preferred embodiment.

FIG. 8 is a flowchart showing the method of operation of the DDP 302. The DDP 302 receives two sets of ordered shapes, one set having RS's and the other set having TS's. The shapes can be ordered using any of a variety of techniques, for example physical ordering, geographical ordering, fixed grid ordering, variable grid ordering, K-tree ordering, or quad-tree ordering. The DDP 302 selects 802 a shape from the first set of shapes SD1. In this example, the first set represents RS's. Alternatively, the first set can represent TS's. The DDP 302 selects 804 a shape, e.g., TS 404, from the second set, SD2. The DDP 302 then determines 806 whether the two selected shapes interact. Any technique for determining if two shapes interact can be used. As an example, if a device rule defines an interaction to be any overlap or abutting of two shapes, and the two shapes were both geometrically rectangular, the DDP 302 calculates the sides of each shape and compares the sides to determine if they meet or overlap. In the example, the DDP 302 determines 806 that RS 402 and TS 404 interact. Therefore, the DDP 302 stores 808 the shapes, i.e., RS 402 and TS 404, for subsequent retrieval by the AS 202. The DDP 302 iterates 810 through each shape in the second set and then iterates 814 through each shape in the first set before returning 816 to the CDP 304.

The CDP 304 returns 908 control to the HAE 206. The HAE 206 returns 718 control to the MAP 202. The MAP 202 returns 616 control to the AS 202 after determining 608 that all RS's have been selected. The AS 202 determines 524 that the identified shape data set stored in the data module 208 by the DDP 302 does not satisfy the device definition because only one TS 404 interacts with the RS 402. The AS 202 selects 510 a new cell from the lowest available level and repeats steps 514–530.

The AS 202 selects 510 cell T after selecting all cells lower in the hierarchy. The AS 202 invokes 520 the MAP 204 to identify all data sets, i.e., RS-TS combinations, that are candidates for devices. The MAP 204 receives 602 the shape data from the data module 208 and, using the HAE 206, determines that the RS 402 is in cell C, the TS 404 is in cell A, and the TS 406 is in cell B. The MAP 204 selects 610 the RS 402 and iteratively invokes 614 the HAE 206 to determine if the RS 402 and each of the TS's 404, 406 interact. As described above, the HAE 206 receives 702, the RS 402 and a TS 406. The MAE 206 determines 714 that neither shape data are located in cell T, i.e., they are both located in children cells of cell T. Therefore, the HAE invokes 716 the CCP 306 to determine if RS 402 and TS 406 interact.

Figure 10A:
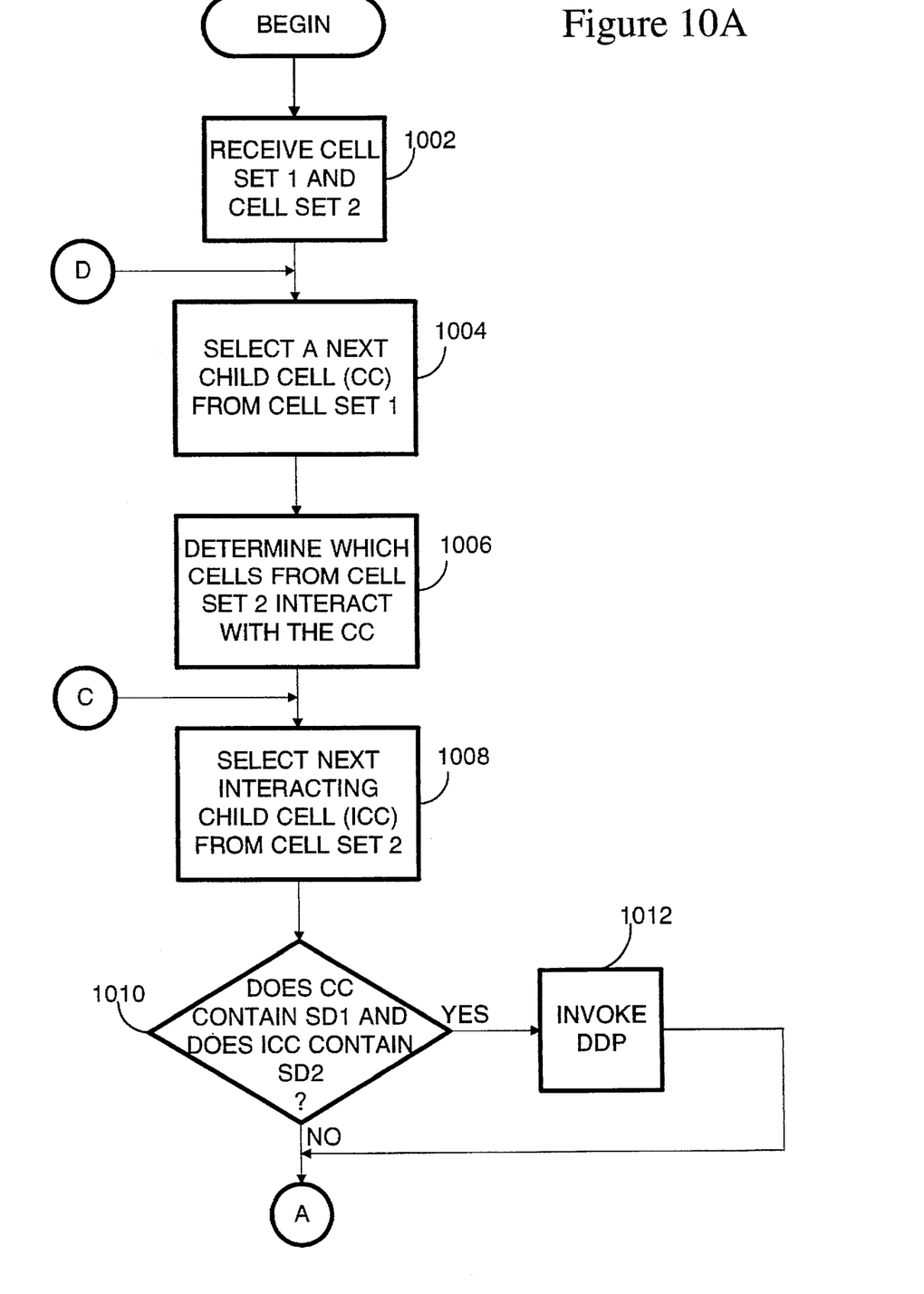
FIGS. 10A–10C are flowcharts showing the method of the cell-to-cell processor module of the preferred embodiment.
Figure 10B:
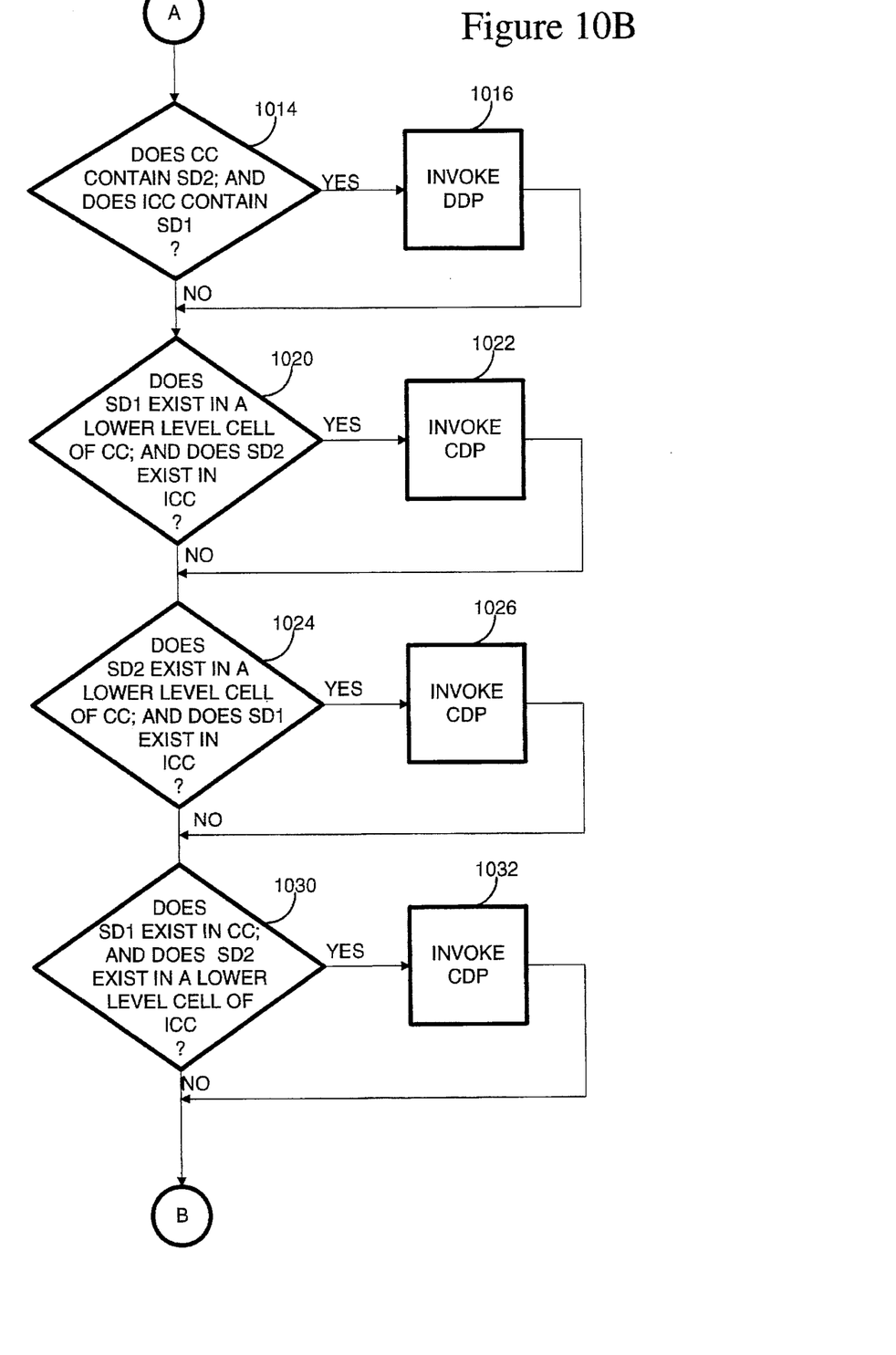
Figure 10C:
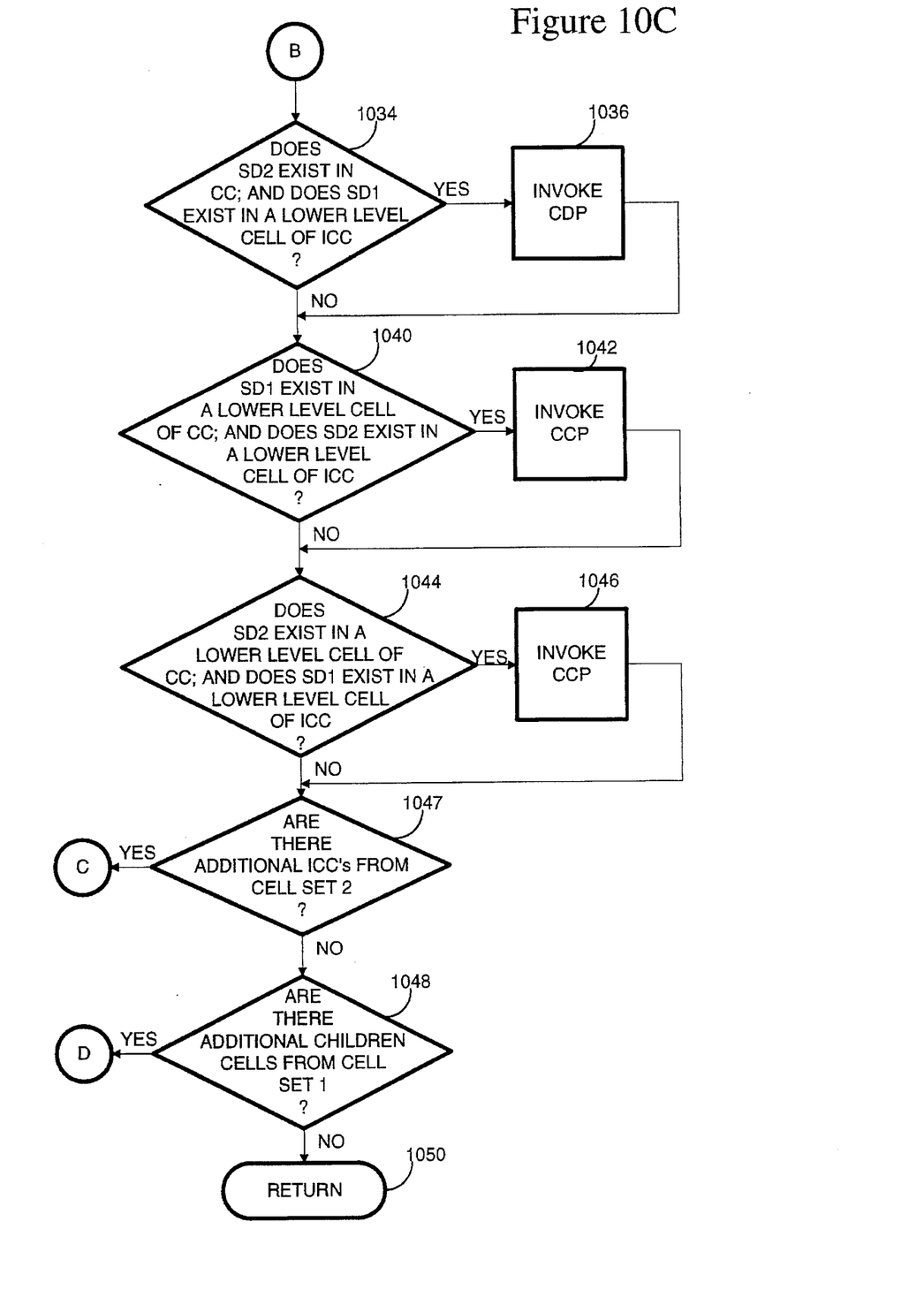

FIGS. 10A–10C are flowcharts showing the method of operation of the CCP 306. The CCP 306 receives 1002 two sets of cells, cell set 1 and cell set 2. In the example, cell set 1 includes cell A and cell set 2 includes cell B. The CCP 306 selects 1004 a child cell (CC) from the cell set 1, e.g., cell A. The CCP 306 determines 1006 which cells from cell set 2 interact with the CC. Cell B is the only cell from cell set 2 that interacts with cell A. Therefore, the CCP 306 selects 1008 cell B as an interacting child cell (ICC). The CCP determines 1020 that the TS 406, i.e., one shape in the second set of shapes SD2, is located in cell B, i.e., the ICC, and that the RS 402, i.e., one shape in the first set of shapes SD1, is located in a child cell of cell A, i.e., the CC. The CCP 306 invokes 1022 the CDP 304.

The CCP 302 would proceed differently if the design were different. For example, if RS 402 existed in the CC and TS existed in ICC 1010 the CCP 306 would invoke 1012 the DDP 302. If RS 402 existed in the ICC and TS existed in CC 1014 the CCP 306 would invoke 1016 the DDP 302. If TS existed in a child cell of the CC and RS existed in the ICC 1024, the CCP 306 would invoke 1026 the CDP 304. If RS existed in the CC and TS existed in a child cell of the ICC 1030, the CCP 306 would invoke 1032 the CDP 304. If TS existed in the CC and RS existed in a child cell of the ICC 1034, the CCP 306 would invoke 1036 the CDP 304. If RS existed in a child cell of the CC and TS existed in a child cell of the ICC 1040, the CCP 306 would recursively invoke 1042 the CCP. If TS existed in a child cell of the CC and RS existed in a child cell of the ICC 1044, the CCP 306 would recursively invoke 1046 the CCP.

In the example, as stated above, the CCP 306 invokes 1022 the CDP. The CDP 304, whose method of operation is described above with reference to FIG. 9, receives 901 input cells and input shapes and selects 902 cell C. The CDP 304 determines 905 that the RS 402 is located in cell C and invokes 906 the DDP 302. The DDP 302, using the above described technique, determines that the RS 402 and the TS 406 interact. The DDP 302 stores 808 RS 402 and TS 406 and returns control 816 to the CDP 304. The CDP 304 returns control 908 to the CCP 306. After all interacting child cells have been selected 1047 from cell set 2 and all children cells have been selected from cell set 1 1048, the CCP 306 returns control 1050 to the HAE 206. The HAE 206 returns control 718 to the MAP 204. At this point the interaction between the RS 402 and the TS 406 has been identified and stored in the data module 208.

Next, the MAP 204 determines whether the RS 402 and the other TS 404 interact. As described above, the MAP 204 iteratively invokes 614 the HAE 206 to determine if RS 402 and TS 404 interact. The HAE 206 receives 702 the current cell data that include the RS 402 and the TS 404. The HAE 206 determines 714 that RS 402 and TS 404 are both located in children cells of cell T. Therefore, the HAE 206 invokes 716 the CCP 306. The CCP 306 receives two cell sets. Cell set 1 includes cell A. Cell set 2 also includes cell A because cell C is a child of cell A. The CCP 306 selects 1004 a CC, i.e., cell A, from cell set 1. The CCP 306 determines 1006 which cell from cell set 2 interact with the CC. The CCP 306 determines 1006 that cell A interacts with itself. The CCP 306 selects cell A to be the ICC. Therefore, cell A is both the CC and the ICC. The CCP 306 determines 1020 that RS 402 is located in a child cell of cell A and that the TS is located in cell A and invokes 1022 the CDP 304.

The CDP 304 selects 902 cell C, determines 905 that the RS 402 is located in cell C, and invokes 906 the DDP 302. Using the technique described above, the DDP 302 determines 806 that the RS 402 and the TS 404 interact. The DDP 302 returns control 816 to the CDP 304 that returns control 908 to the CCP 306. The CCP 306 returns control 1050 to the HAE 206. Then the HAE 206 returns control 718 to the MAP 204 and the MAP 204 returns control 616 to the AS 202. The interaction between the RS 402 and the TS 406 has been identified and stored in the data module.

The AS 202 retrieves the stored data set and determines 524 that the shape data set satisfies the device definition, described above. The AS 202 stores 526 the shape data with the design data of the cell. The AS 202 masks 528 the RS 402 to prevent the RS 402 from being identified and associated with another device. After determining 530 that the top cell has been selected, the AS 202 repeats steps 510–530 for each rule in the RS group. The AS 202 repeats steps 508–534 for each recognition shape in the IC design. After all recognition shapes have been processed 536 the AS 202 determines 538 if any recognition shapes have not been masked and generates 540 an error message if one or more recognition shapes are unmasked.

The hierarchical device extractor 120 identifies device components that are located within one or more cells even if the cells are hierarchical in relation to each other. The hierarchical device extractor 120 permits a IC designer to develop more complex designs and more efficient designs by removing the limitation that all components must exist within one cell.

What is claimed is:

1. A method for extracting a first device having a recognition component and a terminal component from a first representation of an integrated circuit mask, the first representation including the recognition component and the terminal component located in two or more of a hierarchy of cells, a first rule defining the first device as a first relationship between the recognition component and the terminal component, the method comprising the steps of:

(1) selecting a first cell of the hierarchy of cells wherein all child cells of said first cell have been previously selected;

(2) identifying the recognition component if the recognition component is located in one of said first cell and a first child cell of said first cell, the recognition component is a shape on the integrated circuit mask;

(3) identifying the terminal component if the terminal component is located in one of the first cell and a second child cell of the first cell, if the recognition component is identified in step (2), the terminal component is a shape on the integrated circuit mask; and (4) extracting the first device if a relationship between the recognition component and the terminal component satisfies the first rule.

2. The method of claim 1, wherein said first cell includes the recognition component and the terminal component and the recognition component and the terminal component are on different mask levels of the integrated circuit mask.

3. The method of claim 1, wherein said recognition component is located in said first child cell and said terminal component is located in one of said first cell and said second child cell.

4. The method of claim 1, further comprising the steps of:

(a) identifying a first group of rules each describing a relationship between the recognition component and one or more additional components, wherein the first device includes one recognition component and one or more terminal components;

(b) select the recognition component; and (c) selecting the first rule from said first group of rules.

5. The method of claim 4, wherein step (1) includes the steps of:

determining if all child cells from the first cell have been previously selected;

determining if all sibling cells of all child cells have been previously selected; and selecting said first cell if all child cells have been previously selected and all sibling cells have been previously selected.

6. The method of claim 5, further comprising the step of:

(5) repeating steps (1) through (4) until one of all cells are selected and said first device is extracted.

7. The method of claim 6, further comprising the steps of:

repeating steps (1) through (5) for each rule in said first group of rules.

8. The method of claim 7, further comprising the step of:

repeating steps (c) and (1) through (5) for each recognition component.

9. The method of claim 6, wherein step (2) includes the step of:

merging a first portion of said recognition component located in a second cell and a second portion of said recognition component located in a third cell when said second and third cells are each one of said first cell and said child cells of said first cell.

10. The method of claim 9, wherein step (3) includes the step of:

merging a first portion of said terminal component located in a second cell and a second portion of said terminal component located in a third cell when said second and third cells are each one of said first cell and said child cells of said first cell.

11. The method of claim 10, wherein step (4) includes the step of:

identifying the first relationship defined by the first rule; and comparing the first relationship with the relationship between the recognition component and the terminal component.

12. The method of claim 11, further comprising the step of:

storing an indication that the recognition component is not available for future identification in steps (2) and (3).

13. The method of claim 12, further comprising the step of:

repeating steps (b) through (c) and steps (1) through (4) for a second device.

14. A method for extracting a first device having a recognition component and a terminal component from a first representation of an integrated circuit mask, the first representation including the recognition component and the terminal components located in two or more of a hierarchy of cells, a first rule defining the first device as a first relationship between the recognition component and the terminal component, the method comprising the steps of:

(1) identifying a first group of rules each describing a relationship between the recognition component and one or more additional components, wherein the first device includes one recognition component and one or more terminal components;

(2) select the recognition component;

(3) selecting the first rule from said first group of rules;

(4) selecting a first cell of the hierarchy of cells, wherein all child cells of said first cell have been previously selected;

(5) identifying the recognition component if the recognition component is located in at least one of said first cell and all of said child cells of said first cell including the step of merging the first component if the recognition component is located in two or more of said hierarchy of cells, the recognition component is a shape on the integrated circuit mask;

(6) identifying the terminal component if the terminal component is located in at least one of said first cell and all of said child cells of said first cell if the recognition component is identified in step (5), the terminal component is a shape on the integrated circuit mask; and (7) extracting the first device if a relationship between the recognition component and the terminal component satisfies the first rule.

15. A computer based system having a storage device for extracting a first device having a recognition component and a terminal component from a first representation of an integrated circuit mask, the first representation including the recognition component and the terminal components located in two or more of a hierarchy of cells, a first rule defining the first device as a first relationship between the recognition component and the terminal component, the system comprising:

a rule identifier for identifying a first group of rules each describing a relationship between the recognition component and one or more additional components, wherein the first device includes one recognition component and one or more terminal components;

a recognition component selector, disposed to receive signals from said rule identifier, for selecting the recognition component, the recognition component is a shape on the integrated circuit mask;

a rule selector, disposed to receive signals from said rule identifier, for selecting the first rule from said first group of rules;

a cell selector for selecting a first cell of the hierarchy of cells, wherein all child cells of said first cell have been previously selected;

a component identifier, disposed to receive signals from said recognition component selector, for identifying the recognition component if the recognition component is located in at least one of said first cell and all of said child cells of said first cell including the step of merging the recognition component if the recognition component is located in two or more of said hierarchy of cells and for identifying the terminal component if the terminal component is located in at least one of said first cell and all of said child cells of said first cell if the recognition component is identified, the terminal component is a shape on the integrated circuit mask; and a device extractor, disposed to receive signals from said component identifier, for extracting the first device if a relationship between the recognition component and the terminal component satisfies the first rule.

* * * * *